United States Patent [19]
Mäder

[11] Patent Number: 4,914,401
[45] Date of Patent: Apr. 3, 1990

[54] IMPLEMENTATION AND CONTROL OF FILTERS

[75] Inventor: Heinz B. Mäder, Brütten, Switzerland

[73] Assignee: Telefonaktiebolaget L M Ericsson, Stockholm, Sweden

[21] Appl. No.: 194,947

[22] Filed: May 17, 1988

[30] Foreign Application Priority Data

Jun. 18, 1987 [SE] Sweden ............................. 8702561

[51] Int. Cl.⁴ .......................... H03F 3/45; H03B 5/24
[52] U.S. Cl. .................................. 330/261; 330/306; 331/108 B
[58] Field of Search ............... 330/260, 261, 303, 305, 330/306, 252; 307/520; 331/108 B, 135–137

[56] References Cited

U.S. PATENT DOCUMENTS

| | | | |
|---|---|---|---|
| 3,453,553 | 7/1969 | Overbeek et al. | 330/21 |
| 3,812,434 | 5/1974 | Lommers et al. | 330/19 |
| 3,849,735 | 11/1974 | Haenen et al. | 330/30 |
| 3,852,688 | 12/1974 | Takeda | 330/252 |
| 3,983,512 | 9/1976 | Lipscombe | 331/108 B |
| 4,288,754 | 9/1981 | Okada et al. | 330/260 |
| 4,292,597 | 9/1981 | Niimura et al. | 330/254 |
| 4,306,198 | 12/1981 | Okada | 330/260 |
| 4,379,268 | 4/1983 | Nagata | 330/260 |
| 4,605,906 | 8/1986 | Miller | 330/252 X |

FOREIGN PATENT DOCUMENTS

| | | |
|---|---|---|
| 2249024 | 4/1973 | Fed. Rep. of Germany . |
| 375664 | 4/1975 | Sweden . |
| 446680 | 9/1986 | Sweden . |

*Primary Examiner*—James B. Mullins
*Attorney, Agent, or Firm*—Burns, Doane, Swecker & Mathis

[57] ABSTRACT

The invention can be related to the technical field of implementation and control of electricity controllable active fibers.

In accordance with the invention filters are controlled and implemented with the aid of a differential gain stage. Said stage includes pairs of like amplification components ($Q_{J11}$ and $Q_{J21}$, $Q_{J12}$ and $Q_{J22}$, $Q_{J13}$ and $Q_{J23}$), and groups of series-connected diode components as well as at least one current generator (Q1, Q2, Q3). The forward voltage drop of the diode components has the same current responsiveness as the base-emitter voltage of the amplification components. A filter of the first order includes a differential gain stage with a capacitive component (C) connected across the output of said stage or to its amplification components. A filter of the second order can include two differential gain stages, each with its capacitive component (C1, C2) in circuit. An oscillator for controlling filters can comprise three series-connected lowpass filters each including its differential gain stage.

15 Claims, 9 Drawing Sheets

FLL

PLL

IMPLEMENTATION AND CONTROL OF FILTERS

TECHNICAL FIELD

The present invention may be related to the technical field of implementation and control of electrically controllable active filters, where implementation and control thereof is achieved with the aid of a differential gain stage especially invented for this purpose. The differential gain stage can be included in high-pass filters as well as low-pass filters of the first and second order and in an oscillator for controlling such filters.

BACKGROUND ART

Several different types of electrically controllable active filters are well known, as well as their design and manufacture in the form of integrated circuits. It is further known to tune active filters with the aid of an outside phase-locked loop which is locked to a given frequency. A general description of the design and control of active electrical filters for realization in the form of integrated circuits is presented in the article "Analog integrated filters or continous-time filters for LSI and VLSI", REVUE DE PHYSIQUE APPLIQUEE, January 1987, No. 1, pp 3–14. Further information as to the design and control of active filters is given in the references found on pages 13 and 14 in the article.

The U.S. Pat. Nos. 4,288,754 and 4,306,198 teach the use of differential amplifiers with groups of series-connected diodes in the design of electrically controllable active filters.

From the U.S. Pat. No. 4,379,268 it is known in other applications than filters also to use differential amplifiers with groups of series-connected diodes.

DISCLOSURE OF INVENTION

Up to now it has been a problem to design and control electrically controllable active filters for high frequencies in the order of magnitude of 500 MHz. No-less has been a problem to design and achieve control of such filters so that they can be manufactured at low cost in the form of integrated circuits. It has also been a problem to design and control such filters so that they can be tuned over a comparatively large frequency range.

One object of the present invention is to enable implementation and control of electrically controllable active filters for the VHF and UHF bands, preferably for frequencies of the order of magnitude of 500 MHz.

A somewhat different object of the present invention is to achieve implementation and control of electrically controllable active filters for frequencies of the order of magnitude of 500 MHz, such that manufacture can be carried out easily and cheaply in the form of integrated circuits, preferably with the use of bipolar techniques.

A further object of the present invention is to enable the implementation and control of electrically controllable active filters for the VHF and UHF bands, preferably for frequencies of the order of magnitude of 500 MHz, where such filters can be electrically tuned over a comparatively large frequency range.

A still further object of the present invention is to enable the implementation and tuning of an electrically controllable active filter for the VHF and UHF bands, where this filter only requires a supply voltage of about 5 volts.

These and other objects are achieved in accordance with the invention by a differential gain stage specially invented for the purpose, being utilized for the implementation and control of the filters. This stage has two amplification components, at least two groups of series-connected diode components and at least one current generator connected to each other in a certain way, whereby the differential gain stage will be particularly suitable for the purpose.

A filter implemented according to the invention includes at least one differential gain stage. Filters of the second and higher orders can include two or more differential gain stages. An oscillator for controlling a filter via an outside phase-locked loop can contain three differential gain stages.

What is distinguishing for the differential gain stage, as well as the implementation and control of filters including this stage is disclosed in the claims. The implementation and control of electrically controllable active filters with the aid of the differential gain stage in accordance with the invention has several advantages. Filters can be implemented for very high frequencies of the order of magnitude of 500 MHz. The filters can be manufactured as integrated circuits. The filters can be controlled so that they can be tuned over a comparatively large frequency range. The filters can be implemented for, and controlled by, a supply voltage of only about 5 volts. Control can take place using an oscillator implemented in a similar way as a filter, whereby the filter and its control can be manufactured as a single integrated circuit, thus making it possible to compensate for the effect of temperature. Further advantages should be understood by one skilled in the art after studying the description of the preferred embodiments.

BEST MODE FOR CARRYING OUT THE INVENTION

Figure 1:
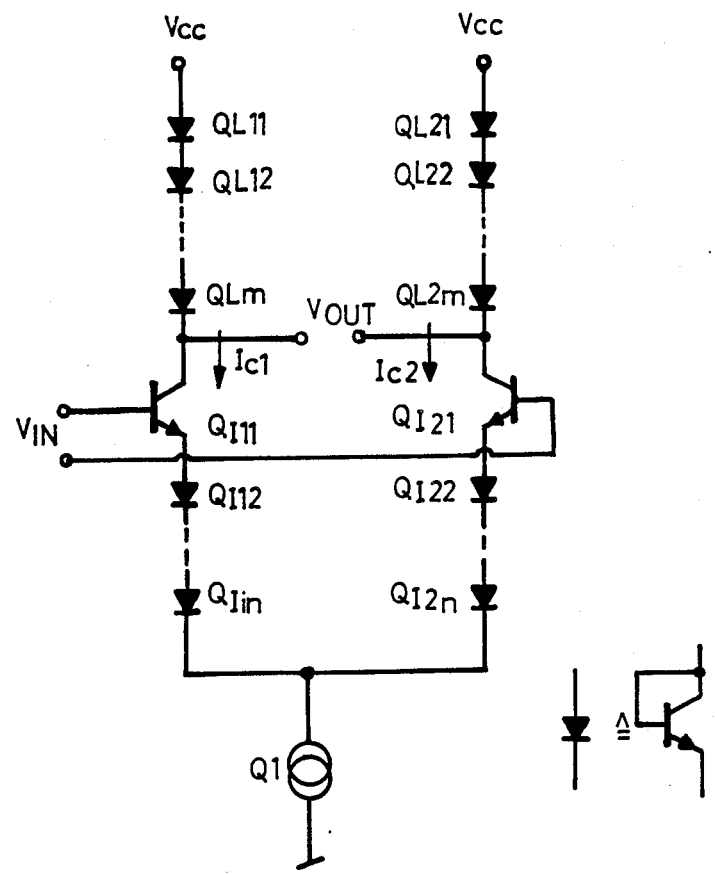
FIG. 1 illustrates a first embodiment of a differential gain stage with series-connected diode components in groups for use in active filters in accordance with the invention.

In FIG. 1 there is illustrated a differential gain stage for use in the implementation and control of active filters. The stage includes a first amplification component $Q_{I11}$ and a second amplification component $Q_{I21}$ in the form of two like NPN transistors with base, emitter and collector electrodes. The base electrodes of the amplification components are connected in counter-phase directly to the differential input of the differential gain stage so that the difference between the potential on the base electrodes increases with increasing magnitude of the voltage $V_{IN}$ across the differential input.

The differential amplifier stage in FIG. 1 includes a plurality of diode components $Q_{L11}, Q_{L12}, \ldots, Q_{L1m}, Q_{L21}, Q_{L22}, \ldots Q_{L2m}, Q_{I12}, \ldots, Q_{I1n}, Q_{I22}, \ldots Q_{I2n}$, in the form of NPN-transistors of the same kind as the components $Q_{I11}$ and $Q_{I21}$. However, the transistors which are diode components have their base electrodes connected directly to their collector electrodes. Each diode component thus has a forward voltage drop corresponding to the base-emitter voltage in an amplification component.

The diode components $Q_{L11}, Q_{L12}, \ldots Q_{L1m}$ are connected in series to form a first group of m diode components. The diode components $Q_{L21}, Q_{L22}, \ldots Q_{L2m}$ are connected in series to form a second group of m diode components.

The first diode component group and the first amplification component are included together with the diode components $Q_{I12}, \ldots Q_{I1n}$ in a first series circuit. The second diode component group and the second amplification component are included together with the diode components $Q_{I22}, \ldots, Q_{I2n}$ in a second series circuit.

The first and second series circuits are connected in parallel to a first current generator $Q_1$ and to a positive or comparatively high supply voltage $V_{cc}$. The current generator is connected to a comparatively low supply voltage or ground so that it strives to keep the sum of the currents through the amplification components constant.

The differential gain stage has its differential output between the collector electrodes of the amplification components. The first group of diode components is thus connected between the supply voltage $V_{cc}$ and one pole of the differential output, while the other group of diode components is connected between the supply voltage $V_{cc}$ and the other pole of the differential output. The first and second groups are thus connected in counterphase directly to the differential output.

For an unloaded differential output, the magnitude of the current through the first group will substantially agree with the current through the first amplification component, whereas the size of the current through the second group will substantially agree with the current through the second amplification component. In addition, the sum of the currents thorough the first and second groups will be substantially constant. Furthermore, within certain limits, there will be substantially linear relationsship between the differential gain stage output voltage $V_{OUT}$ across the differential output and the stage input voltage $V_{IN}$ across the differential input. The relationship is responsive to the number of diode components in the series circuits and can be written: $n \times V_{OUT} = m \times V_{IN}$.

The effective output resistance of a differential gain stage according to FIG. 1 varies with the current through the current generator, and also with the magnitude of the input voltage. The output resistance variation with current is desirable for being able to control a filter in which the differential amplification stage is included. The output resistance variation with input voltage is not desirable on the other hand, because the signal amplitude must then be limited to low levels for reducing the harmonic distortion and for avoiding frequency drift. The usable dynamic range of the differential gain stage would therefore be limited.

A method of increasing the dynamic range of the differential gain stage would be to increase the number of diode components in each series circuit. If the stage is to be driven by a supply voltage of only about 5 volts, the number of diodes and amplification components in each series circuit cannot, however, be greater than four when the diode components are connected according to FIG. 1.

Figure 2:
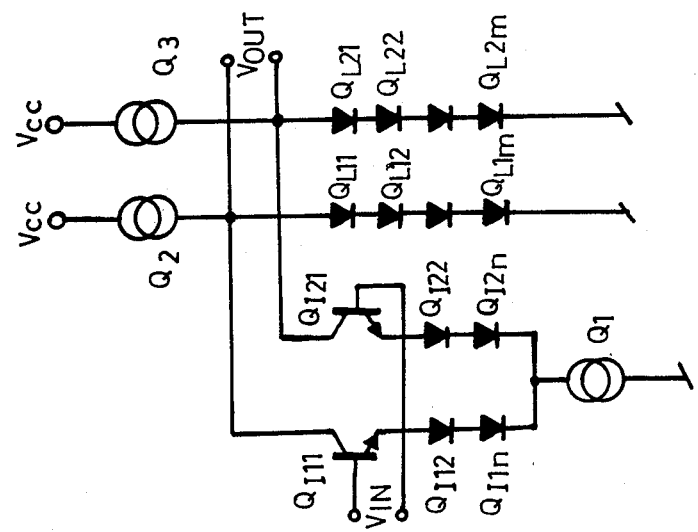
FIG. 2 illustrates a second embodiment of a differential gain stage for use in active filters in accordance with the invention.

In FIG. 2 there is illustrated a second embodiment of a differential gain stage, in which certain diode components are connected in another way than in the differential gain stage according to FIG. 1, whereby the total number of diode components and usable dynamic range of the differential gain stage can be greater.

The differential amplifier stage according to FIG. 2 includes a first amplification component $Q_{I11}$ and a second amplification component $Q_{I21}$ in the form of two like NPN-transistors with base, emitter and collector electrodes. The base electrodes of the amplification components are connected in counterphase directly to the differential input of the differential gain stage.

A first group of n−1 series-connected diode components $Q_{I12}, \ldots Q_{I1n}$ forms a first series circuit together with the first amplification component. A second group of n−1 series-connected diode components $Q_{I22}, \ldots Q_{I2n}$ forms a second series circuit together with the second amplification component. The first and second series circuits are connected in parallel to a first current generator $Q_1$, which is connected to a comparatively low supply voltage, so that it strives to keep the sum of the currents through the series circuits substantially constant.

A third group of m series-connected diode components $Q_{L11}, \ldots Q_{L1m}$ is connected between a second current generator $Q_2$ and the comparatively low supply voltage. The collector electrode of the first amplification component is also connected to the second current generator. One pole of the differential output of the differential amplifier stage is also directly connected to the second current generator.

A fourth group of m series-connected diode components $Q_{L21}, \ldots Q_{L2m}$ is connected between a third current generator $Q_3$ and the comparatively low supply voltage. The collector electrode of the second amplification component is also connected to the third current generator. The second pole of the differential output of the differential gain stage is also directly connected to the third current generator.

The second current generator is connected to the comparatively high supply voltage $V_{cc}$ so that for an unloaded differential input it strives to keep the sum of the currents through the first series circuit and through the third group constant. The third current generator is connected to the comparatively high supply voltage $V_{cc}$ so that for an unloaded differential output it strives to keep the sum of the currents through the second series circuit and through the fourth group constant. The first, second and third current generators are set for generating substantially equally as great currents. For an unloaded differential output, the size of the current through the first amplification component will thus be substantially equal to the magnitude of the current through the fourth group. For an unloaded differential output, the magnitude of the current through the second amplification component will furthermore be substantially equal to the magnitude of the current through the third group.

Each diode component in the first, second, third and fourth groups is a transistor of the same type as the amplification components, but with the base and collector electrodes connected together. The forward voltage drop across each diode component in the first and fourth groups therefore agrees with the base-emitter voltage of the first amplification component. In addition, the forward voltage drop across each diode component in the second and third groups substantially agrees with the base-emitter voltage of the second amplification component. Within certain limits, there is therefore a substantially linear relationship also with the differential amplifier according to FIG. 2 between the differential gain stage output voltage $V_{OUT}$ across the differential output and the differential gain stage input voltage $V_{IN}$ across the differential input. The relationship is responsive to the number of diode components in the third and fourth groups in relation to the number of diode components in the first and second groups, and may be written: $n \times V_{OUT} = m \times V_{IN}$.

For maximum supply voltage of only about 5 volts, the number of diode components in the third and fourth group in FIG. 2 can only be up to four. At the same time, the number of diode components in the first and the second group can be two. Thus, for a supply voltage of 5 volts the number of diode components can be substantially more for a differential gain stage according to FIG. 2 than for such a stage according to FIG. 1. The usable dynamic range of a differential amplifier according to FIG. 2 can therefore be greater than for such an amplifier according to FIG. 1.

Figure 3:
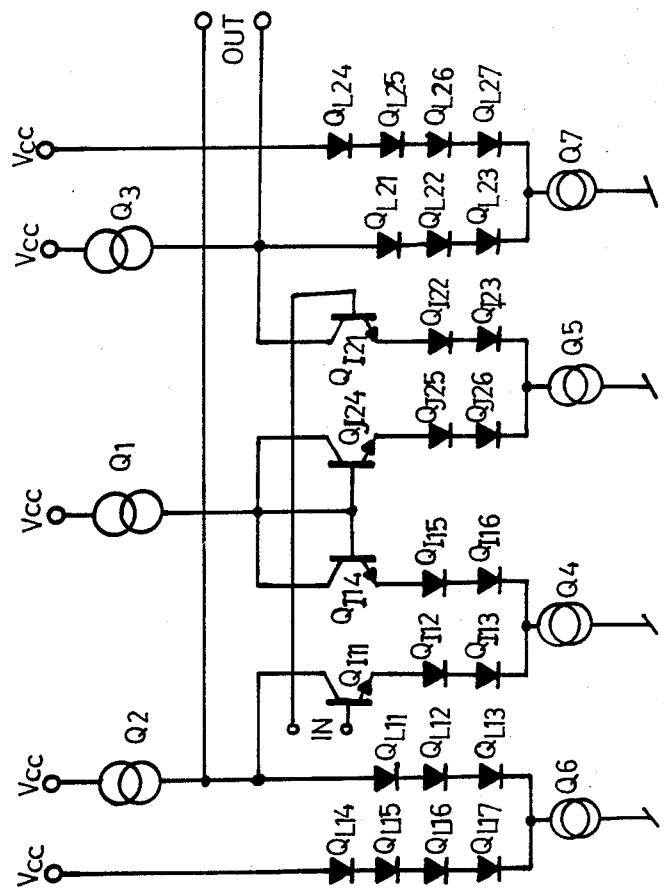
FIG. 3 illustrates a third embodiment of a differential amplifier stage for use in active filters in accordance with the invention.

In FIG. 3 there is illustrated a third embodiment of a differential amplifier stage with more diode components and greater dynamic range than the differential gain stage in FIG. 2. The differential stage in FIG. 3 includes a first amplification component $Q_{f11}$ included in a first series circuit together with a first group of diode components $Q_{f12}$, $Q_{f13}$, a second amplification component $Q_{f21}$ included in a second series circuit together with a second group of diode components $Q_{f21}$, $Q_{f23}$, a third group of series-connected diode components $Q_{L11}$, $Q_{L12}$, $Q_{L13}$, a fourth group of series-connected diode components $Q_{L21}$, $Q_{L22}$, $Q_{L23}$, a fifth group of series-connected diode components $Q_{f14}$, $Q_{f15}$, $Q_{f16}$, a sixth group of series-connected diode components $Q_{f24}$, $Q_{f25}$, $Q_{f26}$, a seventh group of series-connected diode components $Q_{L14}$, $Q_{L15}$, $Q_{L16}$, $Q_{L17}$, an eighth group of series-connected diode components $Q_{L24}$, $Q_{L25}$, $Q_{L26}$, $Q_{L27}$, a first, second, third, fourth, fifth, sixth, seventh current generator $Q_1$, $Q_2$, $Q_3$, $Q_4$, $Q_5$, $Q_6$ and $Q_7$.

The first series circuit and the third group are connected in parallel to the second current generator $Q_2$. The second series circuit and the fourth group are connected in parallel to the third current generator $Q_3$. The fifth and sixth group are connected in parallel to the first current generator $Q_1$. The first series circuit and the fifth group are connected in parallel to the fourth current generator $Q_4$. The second series circuit and the sixth group are connected in parallel to the fifth current generator. The third and seventh groups are connected in parallel to the sixth current generator $Q_6$. The fourth and eighth groups are connected in parallel to the seventh current generator $Q_7$.

The first, second and third current generators are connected to the comparatively high supply voltage $V_{cc}$, while the fourth, fifth, sixth and seventh current generators are connected to the comparatively low supply voltage or ground. The current generators strive to generate equally as great currents.

The amplification components $Q_{f11}$ and $Q_{f21}$ have their control electrodes connected in counterphase directly to the differential input IN of the differential gain stage and their collector electrodes connected in counterphase directly to the differential output OUT of the differential gain stage. The third and fourth groups are connected in counterphase directly to the differential output also.

The diode components are mutually alike and each comprises an amplification component of the same type as the first and second amplification components but with the base and collector electrodes connected together. Each diode component therefore has a forward voltage drop responsive to the currents in the same way as the base-emitter voltage of the amplification components.

The differential gain stage in FIG. 3 functions in a similar way as those of FIGS. 1 and 2, but has more diode components and a greater usable dynamic range. The differential gain stages in FIG. 2 and 3 do not solely have advantages compared with the differential gain stage in FIG. 1. The complexity of the amplification stages is greater, and they have greater stray capacitances, which leads to poorer properties at high frequencies for filters implemented with the aid of the differential gain stages. Transistors of the PNP-type are required for certain of the current generator, while only transistors of the NPN-type are required for the diode components and amplification components. Depending on the manufacturing process, when both PNP and NPN transistors are required in the current generators, this may cause undesired capacitive loads in them. Such capacitive load can deteriorate the properties at high frequencies of filters in which the differential gain stages are included. The differential gain stage in FIG. 1 can therefore be preferable in certain filters, in spite of everything, at least when the high frequency properties are important.

Figure 4:
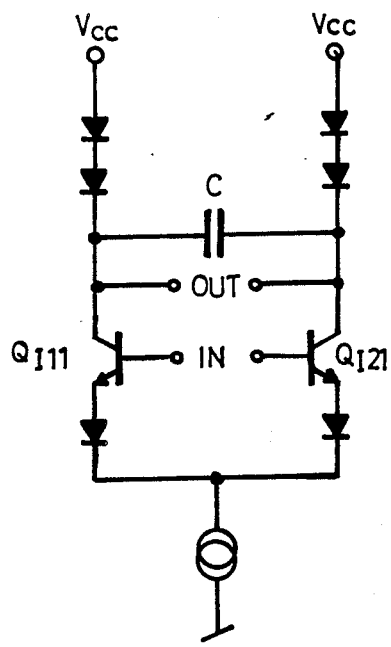
FIG. 4 illustrates a controllable low-pass filter of the first order implemented, in accordance with the invention, with the aid of a differential gain stage according to FIG. 1.

In FIG. 4 there is illustrated a first order low-pass filter implemented with the aid of a differential gain stage according to FIG. 1. The low-pass filter differs from such a differential gain stage in principle only by a capacitive component in the form of a capacitor C connected across the differential output. The low-pass filter thus has a first series circuit with a first group of two diode components, a first amplification component and a further diode component. In addition, the low-pass filter has a second series circuit with a second group of two diode components, a second amplification component and a further diode component. The series circuits are connected in parallel between the comparatively high supply voltage and a current generator.

The low-pass filter in FIG. 4 has substantially the same transfer function as a first order RC-filter. Since the output resistance of the differential gain stage is responsive to the current through the diode components, the output resistance, and thereby limiting the frequency of the low-pass filter, can be controlled by controlling the current through the current generator.

Figure 5:
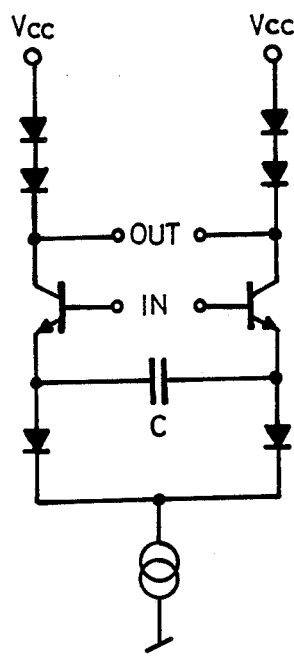
FIG. 5 illustrates a controllable high-pass filter of the first order implemented, in accordance with the invention, with the aid of a differential amplifier stage according to FIG. 1.

In FIG. 5 there is illustrated a filter which attenuates low frequencies by about 6 dB compared with high frequencies. The filter in FIG. 5 includes a differential amplification stage according to FIG. 1. The filter differs from this differential gain stage in principle only by a capacitive component C being connected between the series circuits on the opposite side of the amplification components as is the differential output. The control electrodes of the amplification components are thus connected in counterphase directly to the filter input, while the collector electrodes of the amplification components and groups of diode components are connected in counterphase directly to the filter output.

Figure 6:
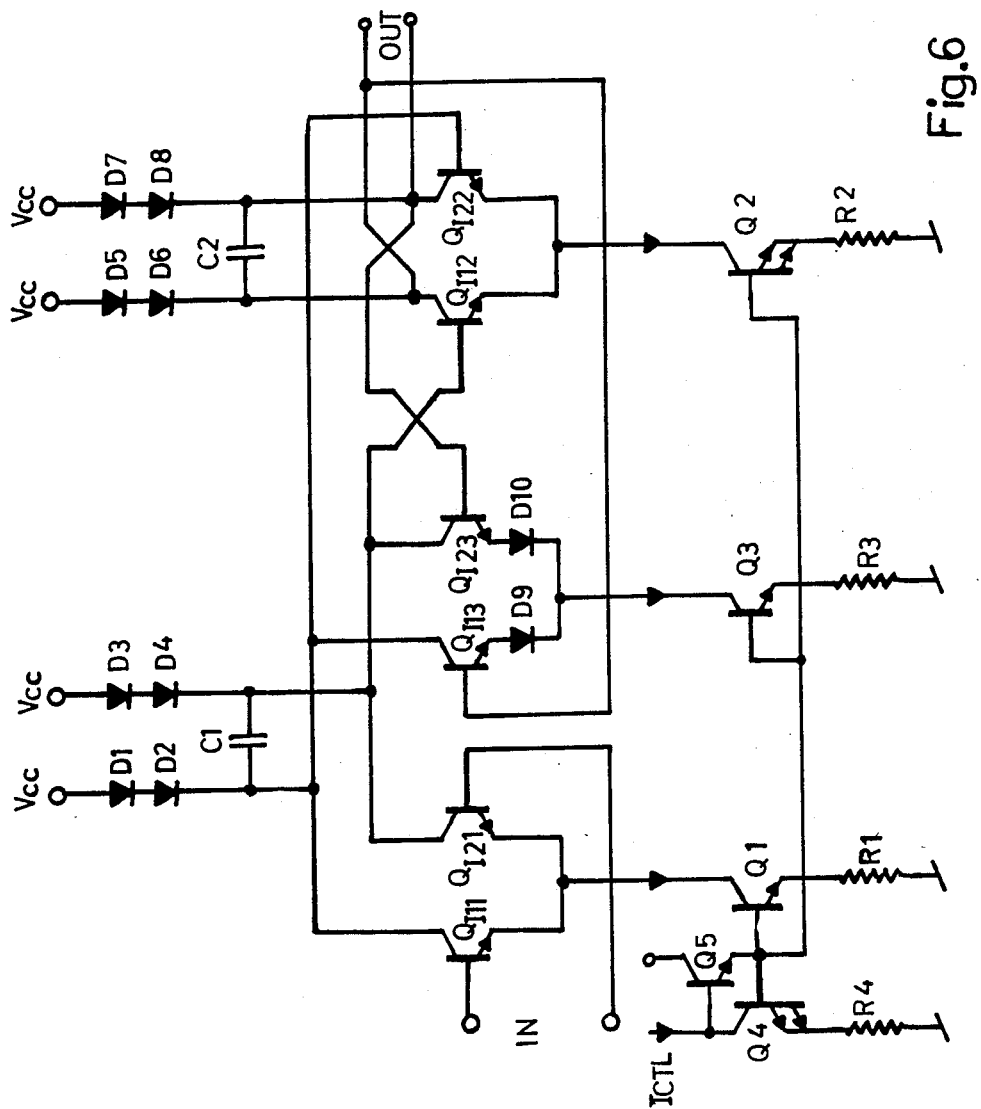
FIG. 6 illustrates a controllable low-pass filter of the second order of the Butterworth type, implemented in accordance with the invention, with the aid of a differential gain stage according to FIG. 1.

In FIG. 6 there is illustrated a second order low-pass filter of the Butterworth type. This filter includes a first low-pass filter similar to the one in FIG. 4, where the input IN constitutes the input of the entire low-pass filter. The first low-pass filter includes a first series circuit with the diode components D1 and D2 as well as the amplification component $Q_{f11}$. The first low-pass filter also includes a second series circuit with the diode components D3 and D4 as well as the amplification component $Q_{f21}$. The first and second series circuit in the first low-pass filter are connected in parallel between the high supply voltage $V_{cc}$ and a current generator $Q_1, R_1$. A capacitive component C1 is coupled across the output of the first low-pass filter.

The low-pass filter according to FIG. 6 also includes a second low-pass filter similar to the low-pass filter in FIG. 4, the output of which constitutes the output of the entire low-pass filter. The second low-pass filter includes a first series circuit with the diode components D5 and D6 as well as the amplification component $Q_{f12}$. The second low-pass filter also includes a second series circuit with the diode components D7 and D8 as well as the amplification component $Q_{f22}$. The first and second series circuits of the second low-pass filter are connected in parallel between the high supply voltage $V_{cc}$ and a current generator $Q_2, R_2$. A capacitive component C2 is connected across the output of the second low-pass filter.

The output of the first low-pass filter is connected to the input of the second low-pass filter. In addition, two substantially alike series circuits are connected to the output of the first low-pass filter. One of these series circuits comprises the amplification component $Q_{f13}$ and the diode component D9, while the second of these series circuits comprises the amplification component $Q_{f23}$ and the diode component D10. Both the last-mentioned series circuits are connected in parallel to a current generator $Q_3, R_3$. The control electrodes of the amplification components $Q_{f13}$ and $Q_{f23}$ are connected in counterphase directly to the output of the second low pass filter.

In the low-pass filter according to FIG. 6, the diode components D1 to and including D10 are commonly alike, which also applies to the amplification components, $Q_{f11}$ up to and including $Q_{f23}$. The current generators $Q_1, R_1$ and $Q_3, R_3$ are also alike, while the current generator $Q_2, R_2$ differs from the other two. The low-pass filter includes means $Q_4, R_4, Q_5$ for synchronous control of the currents through the current generators, these and the control means being dimensioned such that the currents through $Q_1$ and $Q_3$ will be equally as great, while the current through $Q_2$ will be twice as great. The magnitude of the currents through the current generators is controlled with the aid of a current $I_{CTL}$ supplied to the control means.

Figure 7A:
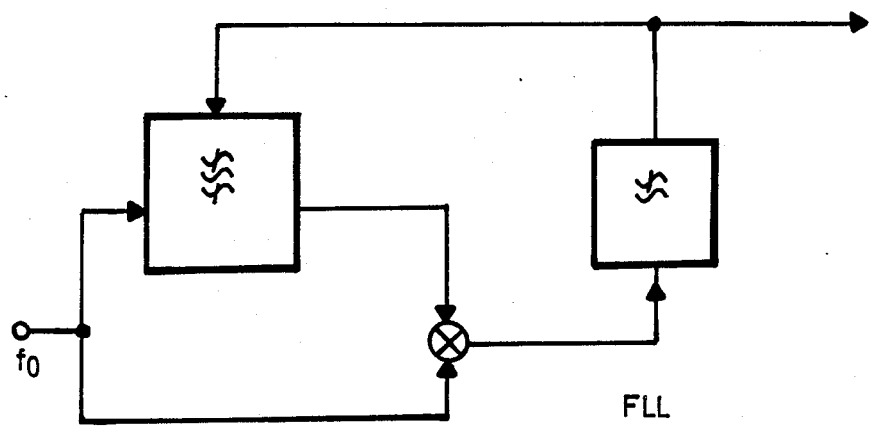
FIGS. 7a and 7b illustrate the prior art in controlling active filters.
Figure 7B:
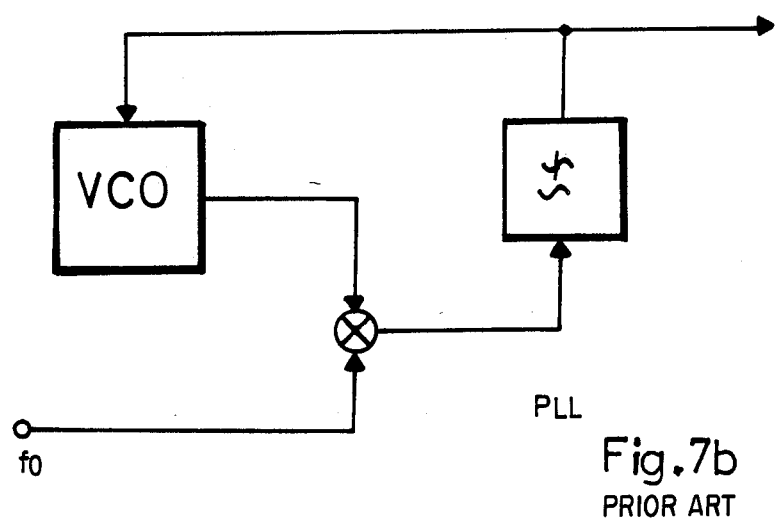

In FIGS. 7a and 7b there is illustrated a simplified block diagram of principles known per se for controlling filters with the aid of an oscillator and a frequency-locked loop FLL and a phase-locked loop PLL, respectively. Since these controlling principles are well known they are not described here. By their use, a current $I_{CTL}$ can be generated for a control means in a filter according to FIG. 6, for example.

Figure 8:
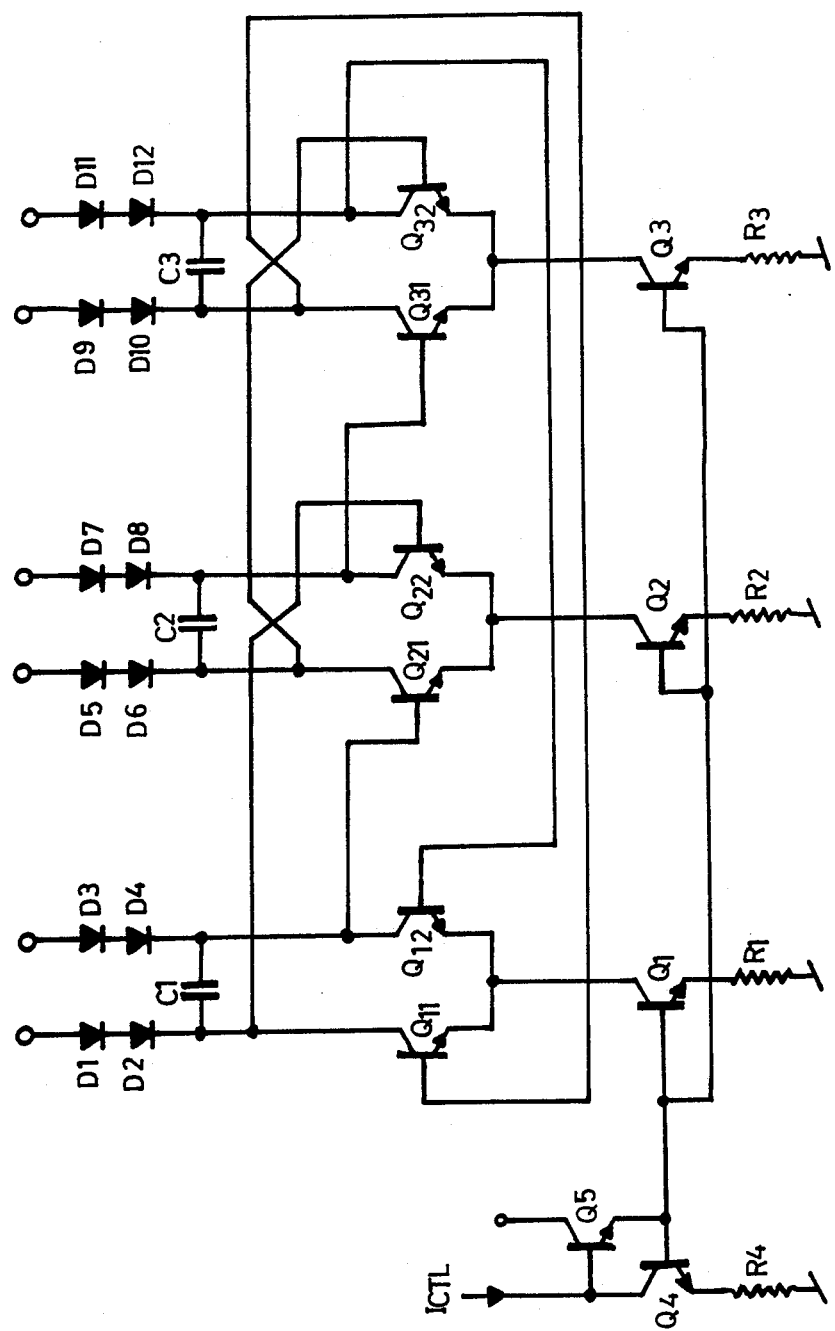
FIG. 8 illustrates an oscillator implemented, with the aid of differential amplifier stage according to FIG. 1, for controlling filters in accordance with the invention.
Figure 10:
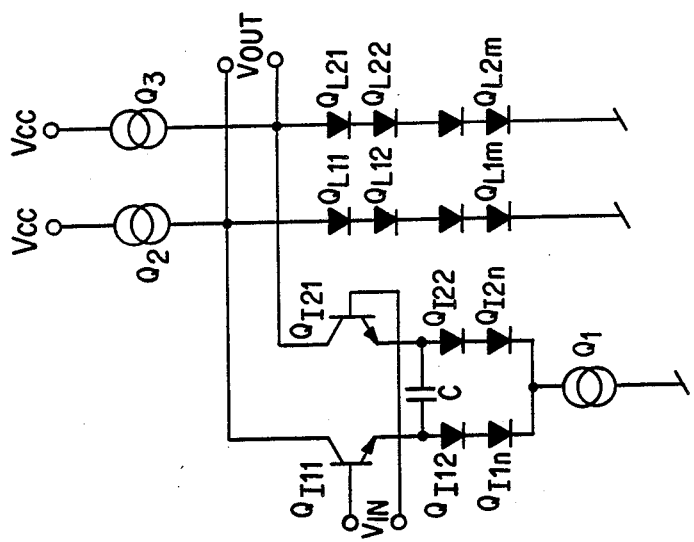
FIG. 10 illustrates a controllable high-pass filter of the first order implemented, in accordance with the invention, with the aid of a differential amplifier stage according to FIG. 2.

An oscillator is illustrated in FIG. 8, for use in controlling filters according to the invention, such that the filters can be controlled according to a known principle illustrated in FIG. 7.

The oscillator according to FIG. 8 includes first, second and third low-pass filters of principly the same kind as illustrated in FIG. 4. The first of these low-pass filters includes diode components D1, D2, D3, D4, the capacitive component C1, amplification components $Q_{11}, Q_{12}$ and the current generator $Q_1, R_1$. The second of these low-pass filters includes the diode components D5, D6, D7, D8, the capacitive component C2, the amplification components $Q_{21}$, and $Q_{22}$ and the current generator $Q_2, R_2$. The third of the low-pass filters includes the diode components D9, D10, D11, D12, the capactive component C3, the amplification components $Q_{31}$ and $Q_{34}$ and the current generator $Q_3, R_3$.

The amplification components $Q_{11}-Q_{32}$ of the low-pass filters are alike. The diode components D1–D12 are also alike, and each diode component comprises an amplification component of the same kind as $Q_{11}-Q_{32}$ but with the base and collector electrodes connected together. The current generators $Q_1, R_1; Q_2, R_2$ and $Q_3, R_3$ are also commonly alike. The oscillator has a control means $Q_4, R_4, Q_5$ for synchronous control of the current generators. Control takes place with the aid of a current $I_{CTL}$ supplied to the control means.

In the oscillator of FIG. 8, the first low-pass filter output is connected to the input of the second low-pass filter. The output of the second low-pass filter is connected to the input of the third low-pass filter. The output of the third low-pass filter is connected to the first low-pass filter input.

Since the oscillator of FIG. 8 principly comprises three low-pass filters implemented with the aid of the same type of differential gain stage as the filters for which the oscillator is implemented for use together with, special advantages are achieved with regard to temperature stability, aging manufacturing tolerances etc.

Figure 9:
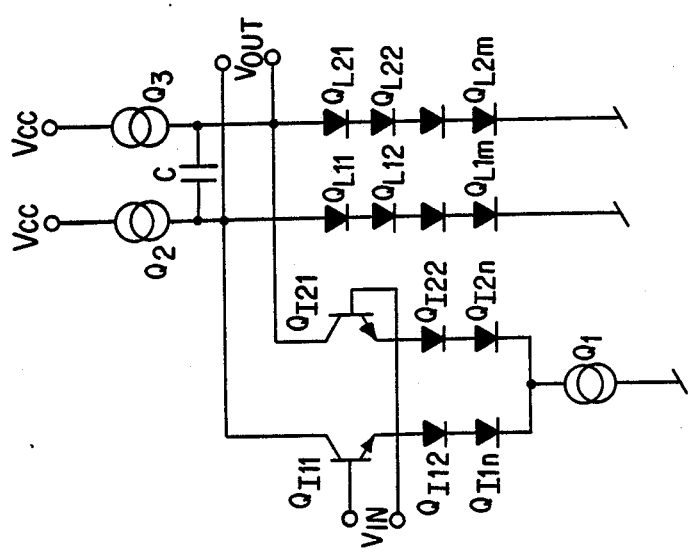
FIG. 9 illustrates a controllable low-pass filter of the first order implemented, in accordance with the invention, with the aid of a differential gain stage according to FIG. 2.
Figure 11:
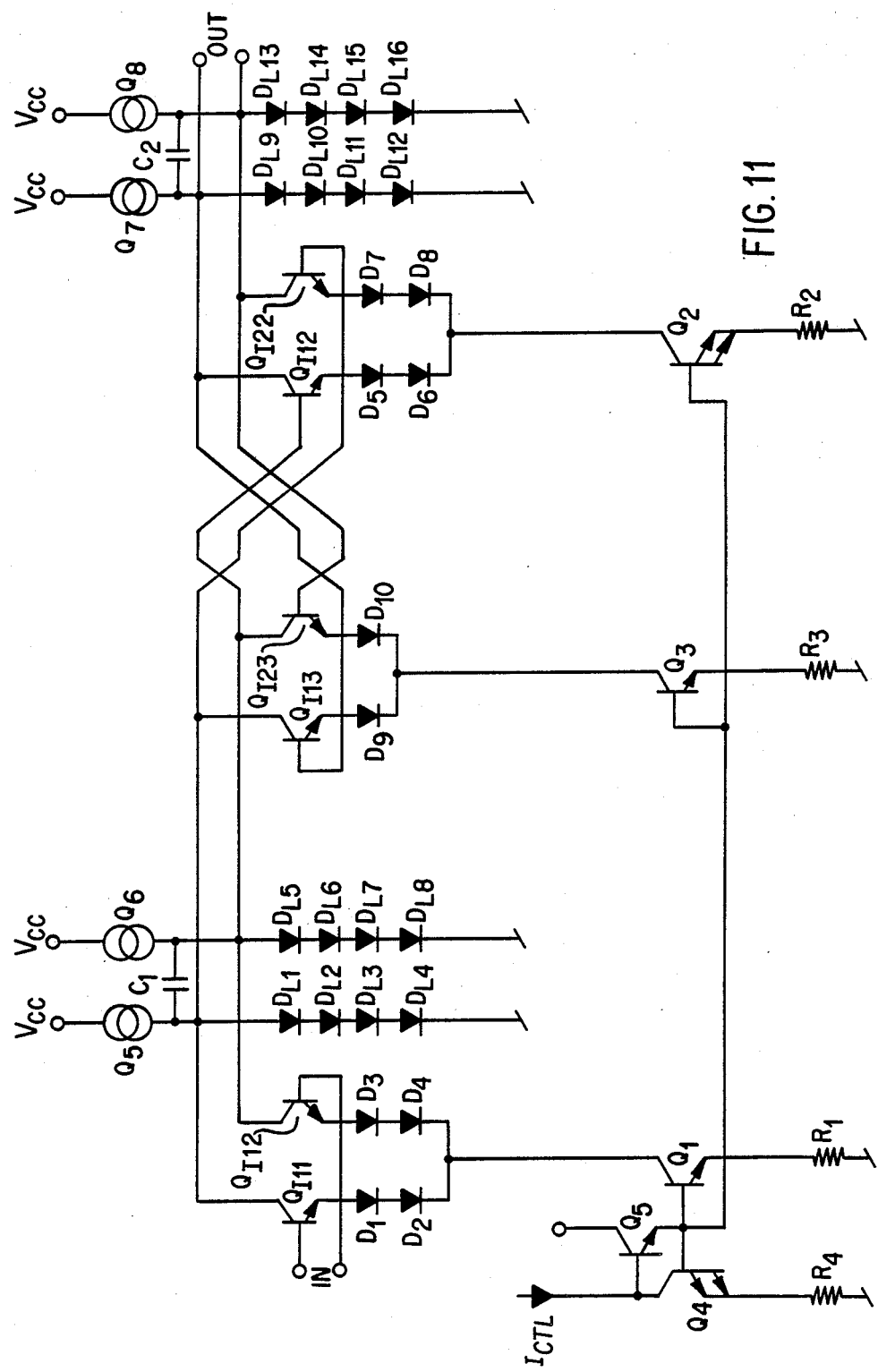
FIG. 11 illustrates a controllable low-pass filter of the second order of the Butterworth type, implemented in accordance with the invention, with the aid of a differential gain stage according to FIG. 2.
Figure 12:
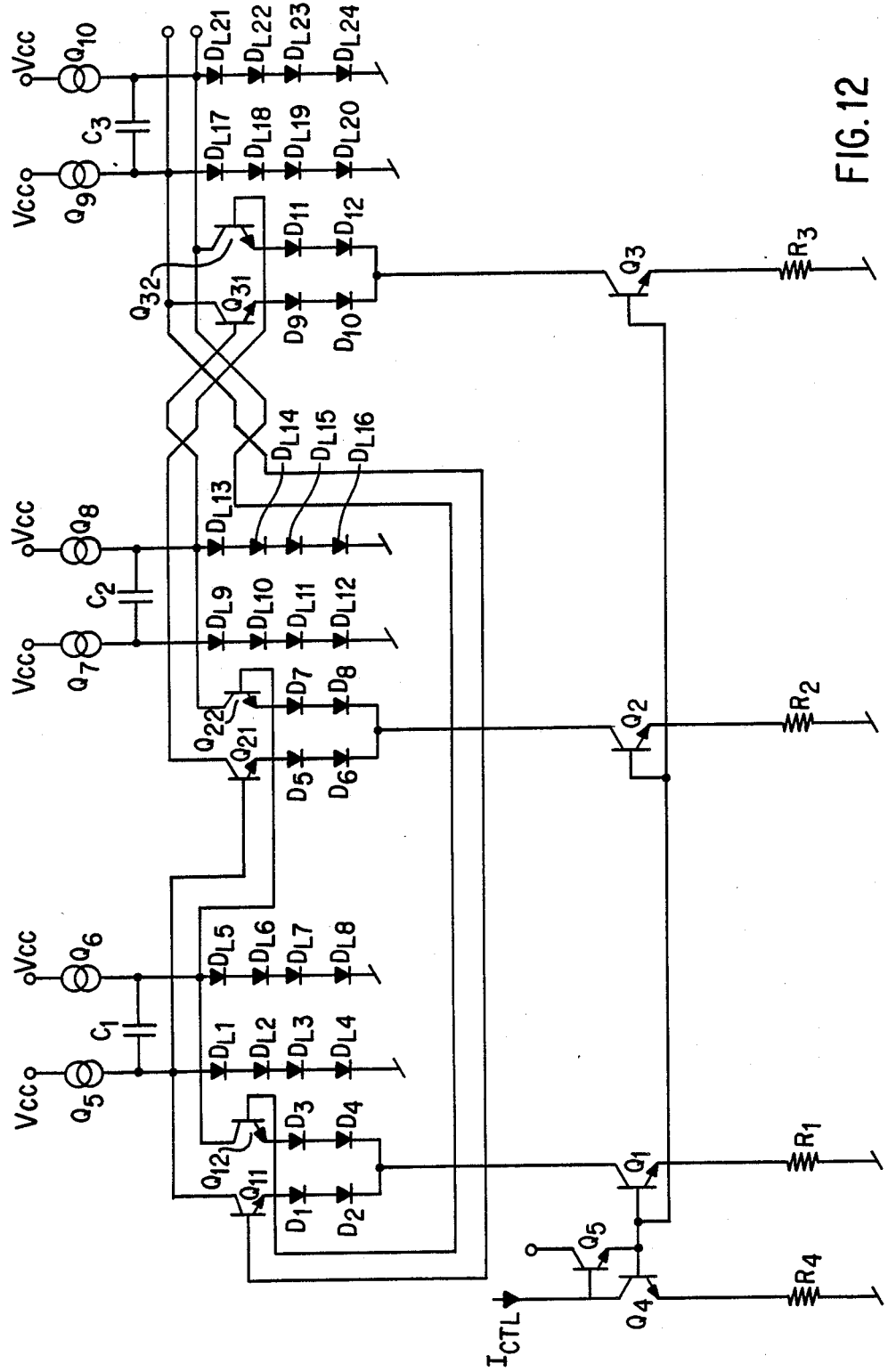
FIG. 12 illustrates an oscillator implemented, with the aid of differential amplifier stage according to FIG. 2, for controlling filters in accordance with the invention.

In FIGS. 4, 5, 6 and 8 there have solely been illustrated implementation and control with the aid of differential gain stages of the more simple type illustrated in FIG. 1. Of course, differential gain stages according to FIG. 2 or 3 can be used for the implementation and control of filters in a similar way. The first-order lowpass filter of FIG. 4, for example, is realized using the differential gain stage of FIG. 2 by placing a capacitor C across the stage output as shown in FIG. 9. Similarly, a first-order high-pass filter using the differential gain stage of FIG. 2 is realized by placing a capacitor C across the emitters of the bi-polar transistors. Direct substitution of the low-pass filter of FIG. 9 for low-pass filter stages of FIGS. 6 and 8 results in the configurations of FIGS. 11 and 12, respectively.

Although the differential gain stage in FIG. 1 and the filters in FIGS. 4, 5 and 6 only include amplification components in the form of NPN transistors with base, emitter and collector electrodes, this is not absolutely necessary, of course. Within the scope of the invention it is naturally conceivable to use somewhat different amplification components of a kind such that the desired relationship between the forward voltage drop of the diode components and the voltage drops of the amplification components can be obtained.

I claim:

1. An active filter comprising a first differential gain stage with a first differential input and a first differential output, said first differential gain stage including two amplification components, at least four diode components, a capacitive component connected in parallel with the differential output of said differential gain stage, and a current generator, said amplification components having substantially equal relationship between current and forward voltage drop, each amplification component having its control electrode connected in counterphase directly to the first differential input, so that the difference between the potentials on the control electrodes increases with increased voltage across the first differential input, said diode components each having substantially the same relationship between current and forward voltage drop as the amplification components, said diode components being series-connected in groups so that there are at least two series-connected diode components in each group, of which groups a first is connected to a first of the amplification components, while a second group is connected to a second of the amplification components, said second group including as many diode components as the first group, said first and second amplification components being coupled in counterphase directly to the first differential output, such that the magnitude of the voltage across the first differential output varies with the difference between the forward voltage drops across the first and the second amplification components, and wherein the first group and second group of diode components are connected in counterphase directly to the first differential output, said current generator being connected to one of the amplification components and the groups, such that for an unloaded first differential output the magnitude of the current through the first group substantially agrees with the magnitude of the current through the first amplification component, while the magnitude of the current through the second group substantially agrees with the magnitude of the current through the second amplification component.

2. A filter as claimed in claim 1, wherein the first amplification component together with the first group are included in a first series circuit, while the second amplification component together with the second group are included in a second series circuit, and wherein the first and second series circuits are connected in parallel to said current generator such that the sum of the current through the first and second amplification components is substantially constant.

3. A filter as claimed in claim 1 further including a second differential gain stage with a second differential input and a second differential output, said second differential gain stage including two amplification components, at least four diode components and at least one current generator, said amplification components of said second stage having substantially equal relationship between current and forward voltage drop, each second-stage amplification component having its control electrode connected in counterphase directly to the second differential input, so that the difference between the potentials on the control electrodes increases with increased voltage across the second differential input, said second-stage diode components each having substantially the same relationship between current and forward voltage drop as the second-stage amplification components, said diode components being series-connected in groups so that there are at least two series-connected diode components in each group, of which groups a first is connected in series with a first of the second-stage amplification components, while a second group is connected in series with a second of said amplification components, said second group including as many diode components as the first group, said first and second amplification components being coupled in counterphase directly to the second differential output, such that the magnitude of the voltage across the second differential output varies with the difference between the forward voltage drops across the first and the second second-stage amplification components, further wherein at least one of the first and second groups, and third and fourth groups, respectively, of diode components are connected in counterphase directly to the second differential output, said fourth group containing in appropriate cases as many diode components as the third group, further including at least one second-stage current generator connected to at least one of the second-stage amplification components and the second-stage groups, such that for an unloaded second differential output the magnitude of the current through the first and fourth groups, respectively, substantially agrees with the magnitude of the current through the first second-stage amplification component, while the magnitude of the current through the second and third groups, respectively, substantially agrees with the magnitude of the current through the second of the second-stage amplification components, and further including a pair of substantially like series circuits, each connected to a further current generator and also each to its own series circuit in the first differential gain stage in the same way as the first capacitive component, said pair of series circuits each having an amplification component with a control electrode, and wherein the output of the first differential gain stage is connected to the input of the second differential gain stage, and the output of the second differential gain stage is connected to the control electrodes of the amplification components in said pair of series circuits.

4. A filter as claimed in claim 3, further including control means for synchronous control of the currents through the current generators of the differential amplifier stages.

5. An oscillator including the filter of claim 1 and further including a second and a third differential gain stage each with a differential input and a differential output, said second and third differential gain stages each including:

two amplification components, at least four diode components and at least one current generator, said amplification components in a stage having substantially equal relationship between current and forward voltage drop, each amplification component in a stage having its control electrode connected in counterphase directly to the differential input of the stage in question, so that the difference between the potentials on the control electrodes increases with increased voltage across the differential input of that stage, said diode components in a stage each having substantially the same relationship between current and forward voltage drop as the amplification components in the same stage, said diode components in a stage being series-connected in groups so that there are at least two series-connected diode components in each group, of which groups a first is connected in series with a first of the amplification components in the stage, while a second group is connected in series with a second of the amplification components in the stage, said second group including as many diode components as the first group, said first and second amplification components in the same stage being coupled in counterphase directly to the first differential output of that stage, such that the magnitude of the voltage across the differential output of that stage varies with the difference between the forward voltage drops across the first and the second amplification components in that stage, and wherein one of the first and second group, and the third and fourth group, respectively, of diode components in a stage are connected in counterphase directly to the differential output of that stage, said fourth group containing as many diode components as the third group, there being at least one current generator connected to at least one of the amplification components and the groups in the same stage, such that for an unloaded differential output the magnitude of the current through the first and fourth groups, respectively, substantially agrees with the magnitude of the current through the first amplification component, while the magnitude of the current through the second and third groups, respectively, substantially agrees with the magnitude of the current through the second amplification component in the same stage, a second capacitive component connected in parallel to the differential output of the second stage, a third capacitive component connected in parallel to the differential output of the third stage, and wherein the differential output of the first stage is connected to the differential input of the second stage, the differential output of the second stage is connected to the differential input of the third stage and the differential output of the third stage is connected to the differential input of the first stage.

6. An amplifier circuit for use in active filters, said device comprising a first differential gain stage with a first differential input and a first differential output, said first differential gain stage including two amplification components, at least four diode components and a first current generator, said amplification components having substantially equal relationship between current and forward voltage drop, each amplification component having its control electrode connected in counterphase directly to the first differential input, so that the difference between the potentials on the control electrodes increases with increased voltage across the first differential input, said diode components each having substantially the same relationship between current and forward voltage drop as the amplification components, said diode components being series connected in groups so that there are at least two series connected diode components in each group, of which groups a first is connected in series with a first of the amplification components, while a second group is connected in series with a second of the amplification components, said second group including as many diode components as the first group, said first and second amplification components being coupled in counterphase directly to the first differential output, such that the magnitude of the voltage across the first differential output varies with the difference between the forward voltage drops across the first and the second amplification components, further including a third and fourth group of diode components connected in counterphase directly to the first differential output, said fourth group containing as many diode components as the third group, said first current generator being connected to at least one of the amplification components and the groups, such that for an unloaded first differential output the magnitude of the current through the fourth group substantially agrees with the magnitude of the current through the first amplification component, while the magnitude of the current through the third group substantially agrees with the magnitude of the current through the second amplification component.

7. A circuit as claimed in claim 6, wherein the first amplification component together with the first group of diode components are included in a first series circuit, while the second amplification component together with the second group of diode components are included in a second series circuit, and wherein the first and second series circuits are connected in parallel to said current generator such that the sum of the currents through the first and second amplification components is substantially constant, further wherein the first series circuit and the third group of diode components are connected in parallel to a second current generator such that the sum of the currents through the first amplification component and the third group is substantially constant for an unloaded differential output, and the second series circuit and the fourth group of diode components are connected in parallel to a third current generator such that the sum of the currents through the second amplification component and the fourth group is substantially constant for an unloaded first differential output, and wherein the first, second and third current generators are adapted to generate substantially equal currents.

8. A filter including the circuit as claimed in claim 7, and further including a capacitive component connected in parallel with the differential output of the differential gain stage.

9. A filter as claimed in claim 8 further including a second differential gain stage with a second differential input and a second differential output, said second differential gain stage including two amplification components, at least four diode components and at least one current generator, said amplification components of said second stage having substantially equal relationship between current and forward voltage drop, each second-stage amplification component having its control electrode connected in counterphase directly to the second differential input, so that the difference between the potentials on the control electrodes increases with increased voltage across the second differential input, said second-stage diode components each having substantially the same relationship between current and forward voltage drop as the second-stage amplification components, said diode components being series-connected in groups so that there are at least two series-connected diode components in each group, of which groups a first is connected in series with a first of the second-stage amplification components, while a second group is connected in series with a second of said amplification components, said second group including as many diode components as the first group, said first and second amplification components being coupled in counterphase directly to the second differential output, such that the magnitude of the voltage across the second differential output varies with the difference between the forward voltage drops across the first and the second second-stage amplification components, further wherein a third and a fourth group of second-stage diode components are connected in counterphase directly to the second differential output, said fourth group containing in appropriate cases as many diode components as the third group, further including at least one second-stage current generator connected to at least one of the second-stage amplification components and the second-stage groups, such that for an unloaded second differential output the magnitude of the current through the first and fourth groups, respectively, substantially agrees with the magnitude of the current through the first second-stage amplification component, while the magnitude of the current through the second and third groups, respectively, substantially agrees with the magnitude of the current through the second of the second-stage amplification components, and further including a pair of substantially like series circuits, each connected to a further current generator and also each to its own series circuit in the first differential gain stage in the same way as the first capacitive component, said pair of series circuits each having an amplification component with a control electrode, and wherein the output of the first differential gain stage is connected to the input of the second differential gain stage, and the output of the second differential gain stage is connected to the control electrodes of the amplification components in said pair of series circuits.

10. A filter as claimed in claim 9, further including control means for synchronous control of the currents through the current generators of the differential amplifier stages.

11. An oscillator including the filter of claim 8 and further including a second and a third differential gain stage each with a differential input and a differential output, said second and third differential gain stages each including:

two amplification components, at least four diode components and at least one current generator, said amplification components in a stage having substantially equal relationship between current and forward voltage drop, each amplification component in a stage having its control electrode connected in counterphase directly to the differential input of the stage in question, so that the difference between the potentials on the control electrodes increases with increased voltage across the differential input of that stage, said diode components in a stage each having substantially the same relationship between current and forward voltage drop as the amplification components in the same stage, said diode components in a stage being series-connected in groups so that there are at least two series-connected diode components in each group, of which groups a first is connected in series with a first of the amplification components in the stage, while a second group is connected in series with a second of the amplification components in the stage, said second group including as many diode components as the first group, said first and second amplification components in the same stage being coupled in counterphase directly to the first differential output of that stage, such that the magnitude of the voltage across the differential output of that stage varies with the difference between the forward voltage drops across the first and the second amplification components in that stage, and wherein the third and fourth groups of diode components in a stage are connected in counterphase directly to the differential output of that stage, said fourth group containing as many diode components as the third group, there being at least one current generator connected to at least one of the amplification components and the groups in the same stage, such that for an unloaded differential output the magnitude of the current through the first and fourth groups, respectively, substantially agrees with the magnitude of the current through the first amplification component, while the magnitude of the current through the second and third groups, respectively, substantially agrees with the magnitude of the current through the second amplification component in the same stage, a second capacitive component connected in parallel to the differential output of the second stage, a third capacitive component connected in parallel to the differential output of the third stage, and wherein the differential output of the first stage is connected to the differential input of the second stage, the differential output of the second stage is connected to the differential input of the third stage and the differential output of the third stage is connected to the differential input of the first stage.

12. A high-pass filter incorporating the circuit as claimed in claim 7 and further including a capacitive component connected to each of the series connected circuits on the opposite side of the respective amplification component as is the differential output of the differential gain stage.

13. A circuit as claimed in claim 7 wherein the sum of the number of series-connected diode components and amplification components in each series circuit is at most four, and the number of diode components in each group is at most four.

14. An amplifier circuit for use in active filters, said device comprising a first differential gain stage with a first differential input and a first differential output, said first differential gain stage including two amplification components, at least four diode components and a plurality of current generators, said amplification components having substantially equal relationship between current and forward voltage drop, each amplification component having its control electrode connected in counterphase directly to the first differential input, so that the difference between the potentials on the control electrodes increases with increased voltage across the first differential input, said diode components each having substantially the same relationship between current and forward voltage drop as the amplification components, said diode components being series connected in groups so that there are at least two series-connected diode components in each group, of which groups a first is connected in series with a first of the amplification components, while a second group is connected in series with a second of the amplification components, said second group including as many diode components as the first group, said first and second amplification components being coupled in counterphase directly to the first differential output, such that the magnitude of the voltage across the first differential output varies with the difference between the forward voltage drops across the first and the second amplification components, further including a third and fourth group of diode components connected in counterphase directly to the first differential output, said fourth group containing as many diode components as the third group, wherein the first amplification component together with the first group of diode components are included in a first series circuit, while the second amplification component together with the second group of diode components are included in a second series circuit, and wherein the first series circuit and the third group of diode components are connected in parallel to a first current generator such that the sum of the currents through the first amplification component and the third group are substantially constant for an unloaded first differential output, and also wherein the second series circuit and the fourth group of diode components are connected in parallel to a second current generator such that the sum of the currents through the second amplification component and the fourth group is substantially constant for an unloaded first differential output, further including a fifth and a sixth group of equal number of diode components connected in parallel to a third current generator such that the sum of the currents through the fifth and the sixth groups is substantially constant, said first series circuit and the fifth group being connected in parallel to a fourth current generator such that the sum of the currents through the first series circuit and the fifth group is substantially constant, and the second series circuit and the sixth group being connected in parallel to a fifth current generator such that the sum of the currents through the second series circuit and the sixth group is substantially constant, and wherein the first, second, third, fourth, and fifth current generators generate substantially equal currents.

15. An active filter comprising a first differential gain stage with a first differential input and a first differential output, said first differential gain stage including two amplification components, at least four diode components, a capacitive component connected between the amplification components on the opposite side of the respective amplification components as is the differential output of the differential gain stage, and at least one current generator, said amplification components having substantially equal relationship between current and forward voltage drop, each amplification component having its control electrode connected in counterphase directly to the first differential input, so that the difference between the potentials on the control electrodes increases with increased voltage across the first differential input, said diode components each having substantially the same relationship between current and forward voltage drop as the amplification components, said diode components being series-connected in groups so that there are at least two series-connected diode components in each group, of which groups a first is connected in series with a first of the amplification components, while a second group is connected in series with a second of the amplification components, said second group including as many diode components as the first group, said first and second amplification components being coupled in counterphase directly to the first differential output, such that the magnitude of the voltage across the first differential output varies with the difference between the forward voltage drops across the first and the second amplification components, and wherein the first group and second group of diode components are connected in counterphase directly to the first differential output, there being at least one current generator connected to one of the amplification components and the groups, such that for an unloaded first differential output the magnitude of the current through the first group substantially agrees with the magnitude of the current through the first amplification component, while the magnitude of the current through the second group substantially agrees with the magnitude of the current through the second amplification component.

* * * * *